(12) United States Patent
Helm et al.

(10) Patent No.: US 10,186,325 B2
(45) Date of Patent: Jan. 22, 2019

(54) METHOD AND APPARATUS FOR SHIELDED READ TO REDUCE PARASITIC CAPACITIVE COUPLING

(71) Applicant: Intel Corporation, Santa Clara, CA (US)

(72) Inventors: Mark Helm, Santa Cruz, CA (US); Aaron Yip, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/451,777

(22) Filed: Mar. 7, 2017

(65) Prior Publication Data

US 2018/0261292 A1    Sep. 13, 2018

(51) Int. Cl.
| | | |
|---|---|---|
| *G11C 16/34* | (2006.01) | |
| *G11C 16/26* | (2006.01) | |
| *G11C 16/10* | (2006.01) | |
| *G11C 16/04* | (2006.01) | |

(52) U.S. Cl.
CPC ...... *G11C 16/3459* (2013.01); *G11C 16/0483* (2013.01); *G11C 16/10* (2013.01); *G11C 16/26* (2013.01); *G11C 16/3427* (2013.01); *G11C 16/3454* (2013.01)

(58) Field of Classification Search
CPC . G11C 16/3454; G11C 16/3427; G11C 16/26; G11C 16/10; G11C 16/0483
See application file for complete search history.

(56) References Cited

U.S. PATENT DOCUMENTS

| 7,257,027 | B2 * | 8/2007 | Park | G11C 16/0483 |
| | | | | 365/185.11 |
| 8,861,276 | B2 * | 10/2014 | Shim | G11C 11/5642 |
| | | | | 365/185.18 |
| 8,976,595 | B2 * | 3/2015 | Jeong | G11C 11/5642 |
| | | | | 365/185.18 |
| 2013/0279251 | A1 * | 10/2013 | Lee | G11C 16/26 |
| | | | | 365/185.03 |
| 2016/0307638 | A1 * | 10/2016 | Shirakawa | G11C 16/3459 |

OTHER PUBLICATIONS

"Session 11, Nonvolatile Memory Solutions," Institute of Electrical and Electronics Engineers, University of Pennsylvania, Feb. 7, 2017, 119 pages.

* cited by examiner

Primary Examiner — Vanthu Nguyen
(74) Attorney, Agent, or Firm — Alliance IP, LLC

(57) ABSTRACT

In one embodiment, an apparatus comprises a NAND flash memory device comprising a memory device controller and a memory NAND flash memory array, the NAND flash memory device to program data into a plurality of NAND flash memory cells coupled to a wordline in a single program sequence, wherein the plurality of NAND flash memory cells are coupled to a first plurality of bitlines and a second plurality of bitlines; couple the first plurality of bitlines to a fixed bias voltage in response to a first read command; apply a read voltage to the wordline coupled to the plurality of NAND flash memory cells; and sense, via the second plurality of bitlines, data stored in NAND flash memory cells coupled to the wordline, wherein at least some bitlines of the second plurality of bitlines are each in between and directly adjacent to two respective bitlines coupled to the fixed bias voltage.

20 Claims, 7 Drawing Sheets

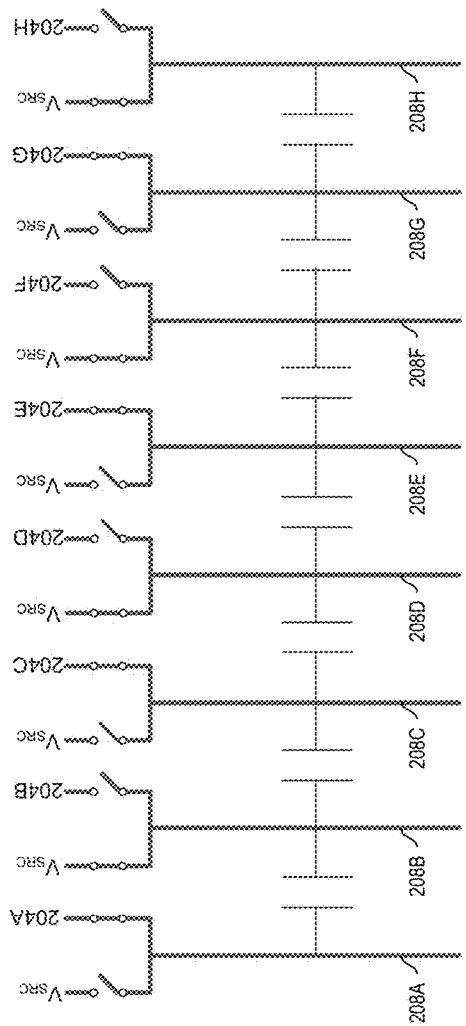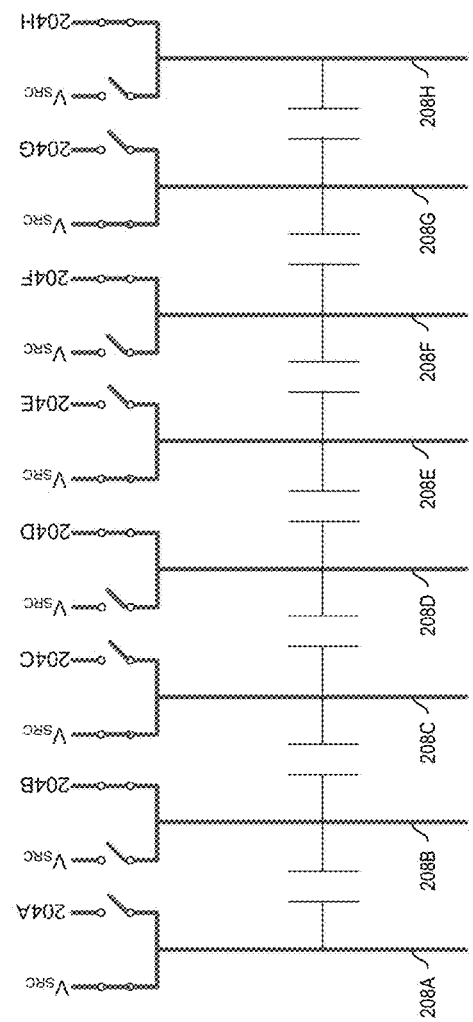
FIG. 4A
FIG. 4B

METHOD AND APPARATUS FOR SHIELDED READ TO REDUCE PARASITIC CAPACITIVE COUPLING

FIELD

The present disclosure relates in general to the field of computer development, and more specifically, to NAND flash memory.

BACKGROUND

A computer system may include one or more central processing units (CPUs) coupled to one or more storage devices. A CPU may include a processor to execute an operating system and other software applications that utilize the storage devices coupled to the CPU. The software applications may write data to the storage devices. The data may be stored by the storage devices in a plurality of memory cells (e.g., NAND flash memory cells) of the storage devices.

BRIEF DESCRIPTION OF THE DRAWINGS

FIGS. 4A and 4B illustrate example bitline configurations for performing shielded reads in accordance with certain embodiments.

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
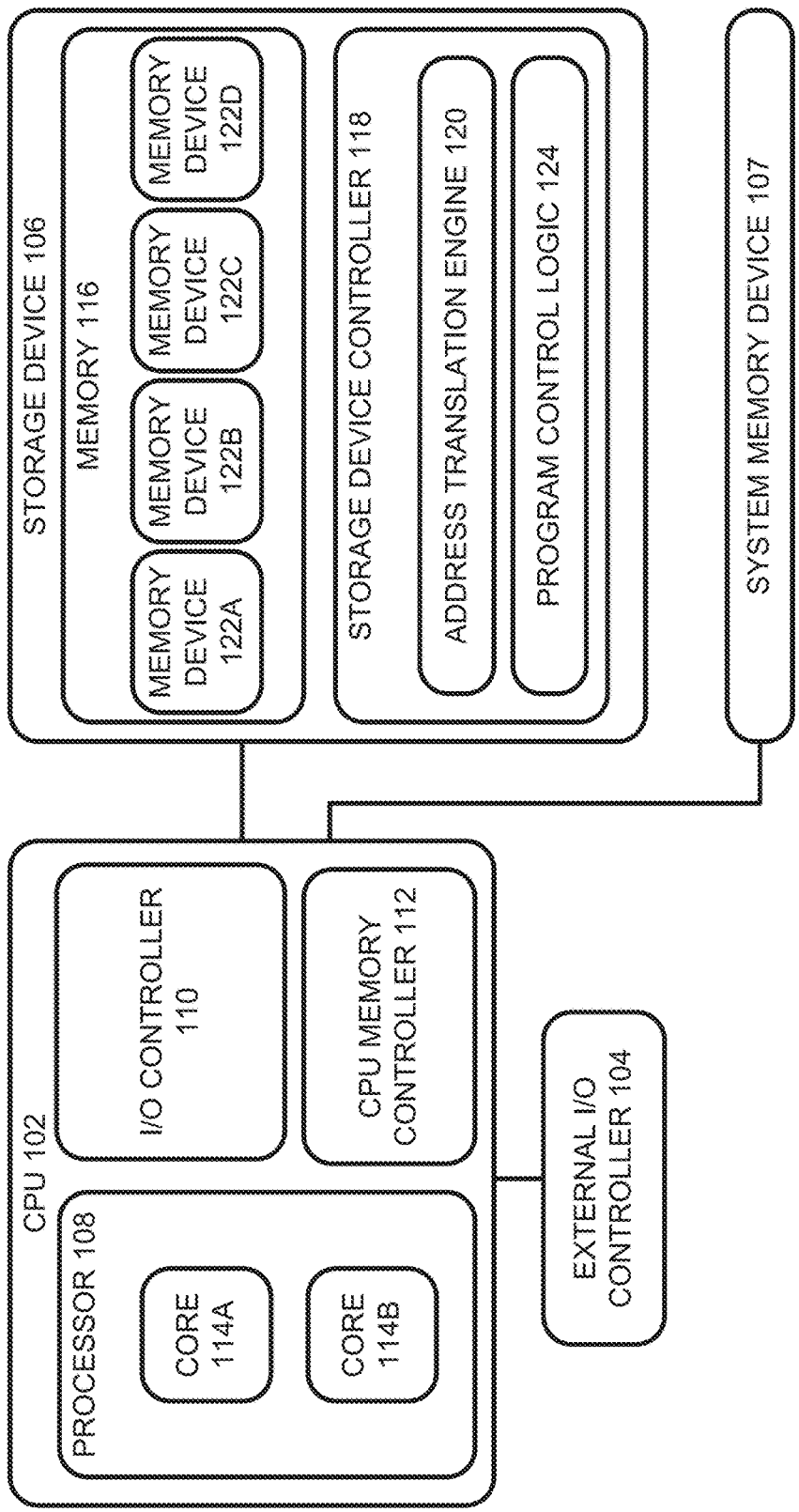
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, storage device 106, and system memory device 107. During operation, data may be transferred between storage device 106 or system memory device 107 and the CPU 102. In various embodiments, particular data operations (e.g., erase, program, and read operations) involving a storage device 106 or system memory device 107 may be managed by an operating system or other software application executed by processor 108.

In various embodiments of the present disclosure, the effect of capacitive coupling between bitlines may be mitigated (thus allowing for faster read times) and memory density may be preserved by performing shielded reads. A shielded read may include coupling a first selection of bitlines of a group of physically contiguous bitlines to a fixed bias voltage and reading data from a second selection of bitlines of the group of physically contiguous bitlines in response to a read command. In response to a subsequent read command (e.g., that requests different data than the first read command), the second selection of bitlines of the group may be coupled to the fixed bias voltage (or another fixed bias voltage) while data is read from the first selection of bitlines of the group. Thus, the bitlines are each selectively coupled to a fixed bias and during a read may either be coupled to the fixed bias or to a memory cell that is being sensed. Various embodiments may provide advantages, such as reduced read time and improved memory density, over all bitline (ABL) architectures and shielded bitline (SBL) architectures which are described in more detail in connection with FIGS. 4A and 4B.

In various embodiments, a storage device 106 comprises NAND flash memory (herein a storage device comprising NAND flash memory is referred to as a NAND flash storage device). In some embodiments, storage device 106 may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 106 may include any number of memories 116 and each memory 116 may include any number of memory devices 122A-D. In the embodiment depicted, memory 116 includes memory devices 122A-D (while specific references herein may be made to memory device 122A, the other memory devices may have any suitable characteristics of memory device 122A).

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other device) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory array is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise executed by the cores 114A and 114B. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A memory device 122A includes a plurality of memory cells that are each operable to store one or more bits. The cells of a memory device 122A may be arranged in any suitable fashion, such as in rows (e.g., wordlines) and columns (e.g., bitlines), three dimensional structures, and/or other manner. In various embodiments, the cells may be logically grouped into banks, blocks, sub-blocks, wordlines, pages, frames, bytes, or other suitable groups. In various embodiments, a memory device 122A comprises one or more NAND flash memory arrays. NAND flash memory arrays are described in more detail in connection with FIG. 2.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

In a particular embodiment, a memory 116 is a semiconductor package. In various embodiments, a semiconductor package may comprise a casing comprising one or more semiconductor dies (also referred to as chips). A package may also comprise contact pins or leads used to connect to external circuits. In a particular embodiment, each memory device 122A is embodied on its own die. Accordingly, in some embodiments, a memory 116 may be a package that includes a plurality of dies that each include a memory device 122A. However, a package is merely one example form a memory 116 may take as a memory device may be any suitable arrangement of one or more memory arrays and associated logic in any suitable physical arrangement. For example, although a single physical package may include a single memory 116, multiple memories 116 could be resident on a single package or a memory 116 could be spread across multiple packages. As another example, a memory 116 may be embodied in one or more different physical mediums, such as a circuit board, die, disk drive, other medium, or any combination of thereof (or combination with one or more packages). Similarly, a die is merely one example of a component that may comprise a memory device 122A, as a memory device 122A may be any suitable arrangement of memory cells and logic associated with the memory cells. For example, although a single die may include a single memory device 122A, multiple memory arrays could be resident on a single die or a memory device 122A could be spread across multiple dies. As another example, a memory device 122A may be embodied in one or more different physical mediums, such as a circuit board, package, disk drive, other medium, or any combination of thereof (or combination with one or more dies). In a particular embodiment, memory 116 comprises a circuit board coupled to a plurality of memory devices 122 that each comprise a semiconductor package.

Storage device 106 may comprise any suitable type of memory and is not limited to a particular speed, technology, or form factor of memory in various embodiments. For example, a storage device 106 may be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory devices(s) thereof), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located (e.g., a logical unit number), one or more pages of the physical memory location, one or more subblocks of the physical memory location, one or more wordlines of the physical memory location, one or more bitlines of the physical memory location, or other suitable identifiers or encodings thereof.

The address translation engine 120 or other portion of storage device 106 may include any suitable memory type for storing logical to physical mapping structures and other information and any suitable logic for changing values stored in the logical to physical mapping structures and other information (e.g., in response to a request from the storage device controller 118) and reading values from the logical to physical mapping structures and other information (e.g., to provide the values to the storage device controller 118 for use in memory operations).

Storage media for the logical to physical mapping structures and other information may be included within the address translation engine 120 and/or storage device controller 118 or may be communicably coupled to the address translation engine and/or storage device controller. In various embodiments, storage media for the logical to physical mapping structures and other information may be integrated on the same package or chip as the storage device controller 118 and/or address translation engine 120 or may be implemented on a separate package or chip.

In various embodiments, the address translation engine 120 and/or storage device controller 118 may provide wear leveling through management of the address mappings of the logical to physical mapping structures and other information. In particular embodiments, the address translation engine 120 and/or storage device controller 118 may also prevent the use of bad memory cells (or logical grouping of cells) by not allowing physical addresses for the bad cells (or logical grouping of cells) to be mapped to the logical address space.

In various embodiments, the storage device 106 also includes program control logic 124 which is operable to control the programming sequence performed when data is written to a memory 116 or the read sequence performed when data is read from a memory 116. In various embodiments, program control logic 124 may provide the various voltages (or information indicating which voltages should be provided) that are applied to one or more memory cells, word lines, bitlines, and/or other portions of a memory array during the programming and/or reading of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
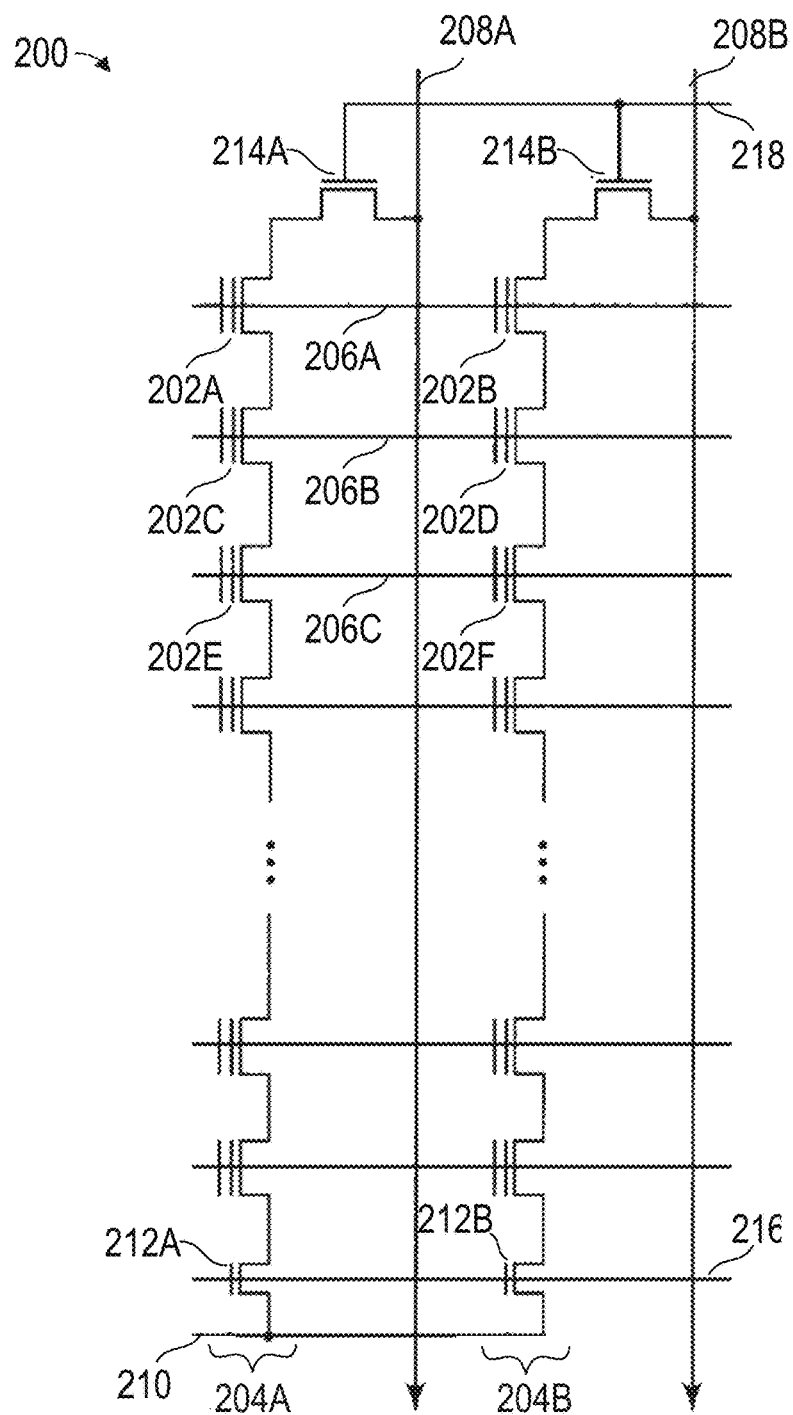
FIG. 2 illustrates an example portion of a NAND flash memory array in accordance with certain embodiments.

FIG. 2 illustrates an example portion of a NAND flash memory array 200 in accordance with certain embodiments. In various embodiments, a memory device 122A may comprise one or more NAND flash memory arrays. NAND flash memory array 200 may comprise a plurality of non-volatile memory cells 202 arranged in columns such as series strings 204. In various embodiments, each memory cell 202 may comprise a transistor with a floating gate that stores charge indicative of one or more bit values stored by the memory cell 202. Other embodiments may include memory cells utilizing replacement gate or charge trap technology. In the series strings 204, the drains of the cells 202 are each (with the exception of the top cell) coupled to a source of another cell 202.

The array 200 also includes wordlines 206 (e.g., 206A-206C). A wordline 206 may span across multiple series strings 204 (e.g., a wordline may be coupled to a memory cell 202 of each series string 204) and is connected to the control gates of the memory cells 202 of a row of the array 200 and used to bias the control gates of the memory cells 202 of the row. The bitlines 208 (e.g., 208A, 208B) are each coupled to a respective series string 204 by a respective drain select gate 214 (e.g., 214A, 214B). The bitlines may also be coupled to sensing circuitry that detects the state of each cell by sensing voltage or current of each sensed bitline 208.

Each series string 204 of memory cells is coupled to a source line 210 by a source select gate 212 and to an individual bitline 208 by a drain select gate 214. The source select gates 212 are controlled by a source select gate control line 216 and the drain select gates 214 are controlled by a drain select gate control line 218. In other embodiments, multiple drain select gate control lines 218 may be used (such that one drain select gate control line may control a subset of the drain select gates 214, another drain select gate control line may control a different subset of the drain select gates 214, and so on). The source line 210 may be coupled to a fixed bias voltage (e.g., $V_{SRC}$). In various embodiments, $V_{SRC}$ may be set to ground or positively biased (e.g., between 0 and ~1.5V).

Figure 3:
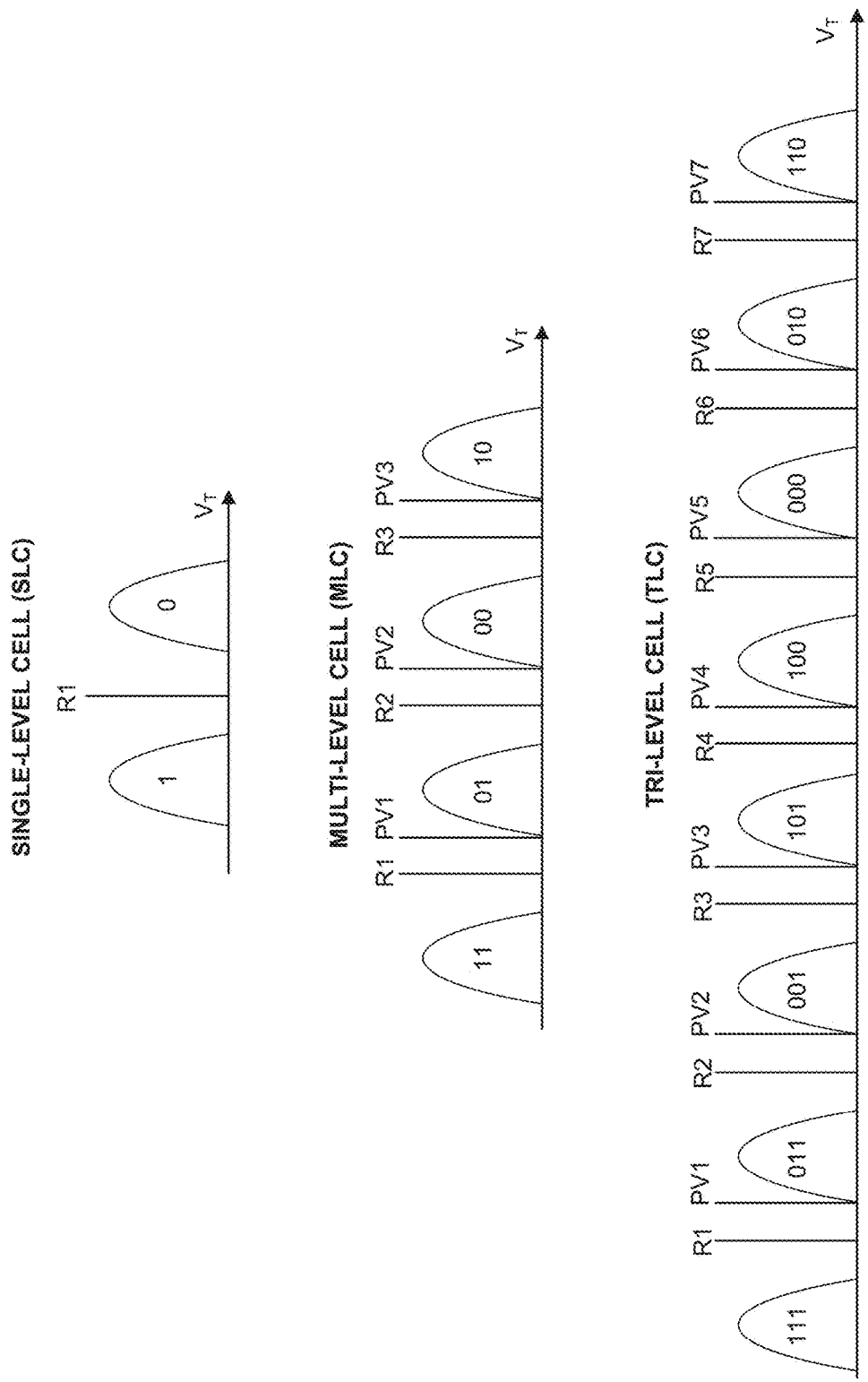
FIG. 3 illustrates example encoding schemes for NAND flash memory cells in accordance with certain embodiments.

In various embodiments, each memory cell 202 can be programmed according to an SLC, MLC, TLC, a QLC, or other encoding scheme. Each cell's threshold voltage (Vt) is indicative of the data that is stored in the cell. FIG. 3 illustrates example encodings of bits within NAND flash memory cells 202 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a wordline when the values of memory cells coupled to that wordline are being read. When a particular read voltage is applied, sense circuitry may determine whether the threshold value of a cell is greater than or less than the read voltage based on a voltage or current sensed by the sense circuitry via the bitline of the cell. Although not shown in FIG. 3, a QLC encoding scheme may utilize a similar scheme where fifteen read voltages may be used to resolve the values of four bits within each cell, where $R1<R2<R3<\ldots<R15$.

The various program verify voltages (PV1-PV3 in the MLC encoding scheme and PV1-PV7 in the TLC encoding scheme) depicted represent program verify voltages that may be applied to cells during programming of the cell to determine whether the threshold voltages of the cells have reached their desired levels.

In particular embodiments, cells may be programmed one or more pages at a time, where a page is stored in a group of cells that are coupled to the same wordline. As one example, the group of cells may be identified by a particular wordline and a particular subblock (where the wordline may be coupled to multiple subblocks of memory cells). As another example, the group of cells may represent all of the cells of the wordline. As another example, the group of cells may represent one half, one fourth, or other portion of the cells of the wordline (or subblock). a group of cells may store one page of data (if the cells are encoded according to an SLC scheme) or multiple pages of data (if the cells are encoded according to an MLC, TLC, QLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different cells of a wordline. For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A programming sequence for a group of cells may comprise programming of all of the intended data (e.g., page(s)) into the group of cells. A programming sequence may include one or more programming passes. A programming pass (which may comprise one or more programming loops) may encode one or more pages. A programming pass may comprise the application of one or more effective program voltages to cells to be programmed followed by the application of one or more verify voltages to these cells in order to determine which cells have finished programming (the application of a program verify voltage and the accompanying sensing operation may be referred to herein as a program verify read command). In some embodiments, one or more loops of a programming pass may comprise the application of one or more effective program voltages without the application of one or more verify voltages. The application of an effective program voltage to a cell may include changing the voltage difference between a control gate and a channel of the cell in order to change the threshold voltage of the cell. Thus, the voltage of a wordline (coupled to the control gate of the target cell) and/or a channel of the cell may be set in order to effectuate application of an effective program voltage. As a "program voltage" is commonly used to refer to a voltage applied to a wordline, the term "effective program voltage" is used herein to refer to the voltage difference between a control gate and channel of a cell (which in instances where the channel is held at 0 V will be synonymous with program voltage).

FIGS. 4A and 4B illustrate example bitline configurations for performing shielded reads in accordance with certain embodiments. These configurations provide various advantages over an all bitline (ABL) architecture and a shielded bitline (SBL) architecture, such as reduced capacitive coupling between sensed bitlines and faster read times.

In an ABL architecture, when a read is performed, data is read from each bitline of a series of physically contiguous bitlines. For example, if the bitlines 208A and 208H were configured in an ABL architecture, during the performance of a read command, each bitline 208A-208H would be sensed in order to determine one or more bits stored in each of a plurality of cells (where each of the cells is coupled to a respective bitline during the read operation). However, because parasitic capacitance may exist between each bitline (as depicted in FIGS. 4A and 4B), a change in voltage of a bitline (e.g., 208B) may affect the voltage of bitlines immediately adjacent to the bitline (e.g., 208A and 208C). For example, when a voltage of the bitline drops, capacitive coupling between the bitline and its immediately adjacent bitlines (i.e., neighbor bitlines) may cause the voltages of the neighbor bitlines to drop. Once the bitline voltage reaches a steady state, the voltages of the neighboring bitlines may recover. However, this may result in a longer waiting time in order to maintain sensing accuracy (e.g., the activation of sense amps or other sensing circuitry may be delayed relative to a configuration in which there is no capacitive coupling between the sensed bitlines in order to allow the worst case bitline to recover before sensing).

In an SBL architecture, the effect of capacitive coupling between bitlines is mitigated by permanently coupling every other bitline to ground (GND) and reading from every other bitline. Thus, if the bitlines depicted in FIG. 4A were arranged in an SBL architecture, a read operation may result in data being read via bitlines 208A, 208C, 208E, and 208G, while bitlines 208B, 208D, 208F, and 208H are tied to GND. Such an architecture may allow the bitlines to be sensed more quickly than in a comparable ABL architecture, but suffers from decreased cell density, since one out of every two bitlines is dedicated as a shielding bitline between its neighbor bitlines and is not capable of being sensed during a read operation.

In various embodiments of the present disclosure, the effect of capacitive coupling between bitlines may be mitigated (thus allowing for faster read times) and memory density may be preserved by coupling a first selection of bitlines of a group of physically contiguous bitlines to a fixed bias voltage and reading data from a second selection of bitlines of the group of physically contiguous bitlines in response to a read command. In response to a subsequent read command (e.g., that requests different data than the first read command), the second selection of bitlines of the group may be coupled to the fixed bias voltage (or another fixed bias voltage) while data is read from the first selection of bitlines of the group. Thus, the bitlines are each selectively coupled to a fixed bias and during a read may either be coupled to the fixed bias or to a memory cell that is being sensed.

As an example, in FIG. 4A, in response to a first read command, bitlines 208B, 208D, 208F and 208H are coupled to a fixed bias ($V_{SRC}$) while bitlines 208A, 208C, 208E, and 208G are each coupled to a respective series string (i.e., 204A, 204C, 204E, and 204G) such that the memory cells in these series strings that are coupled to an activated wordline may be sensed during a first read operation (an activated wordline is a wordline that has a read voltage applied to it while the other wordlines have a high voltage applied to ensure that their respective memory cells are conducting). FIG. 4B depicts the same bitlines in a different configuration effected in response to a second read command that requests the reading of different data than the data read in response to the first read command. In FIG. 4B, the bitlines that were coupled to the fixed bias ($V_{SRC}$) during the first read operation are instead coupled to series strings 204B, 204D, 204F, and 204H to sense a memory cell (coupled to the activated wordline) from each series string during the second read operation. The bitlines that were coupled to series strings during the first read operation are coupled to the fixed bias ($V_{SRC}$) during the second read operation. Each bitline 208 may be selectively coupled to the fixed bias or its respective series string in any suitable manner, such as through one or more switches (which may be implemented, e.g., by transistors or other circuit components). As an example, the sensed bitlines may be coupled to their respective series strings by drain select gates, such as those shown in FIG. 2 (the drain select gates do not all share the same control signal in order to allow some bitlines to be coupled to the series strings while other bitlines are not coupled to the series strings during a read operation).

In the embodiment depicted, half of a group of contiguous bitlines are coupled to the fixed bias while half of the bitlines are sensed, with each sensed bitline (with the possible exception of one or more bitlines at the edge of the group) being in between and directly adjacent to two bitlines coupled to the fixed bias (thus every other bitline is sensed and every other bitline is coupled to the fixed bias). In other embodiments, the proportion of bitlines of a group that are sensed or the proportion of bitlines of a group that are coupled to the bias during a read operation may vary. For example, one out of every four bitlines of a group of contiguous bitlines may be sensed (e.g., every fourth bitline is sensed) while three out of every four bitlines of the group are coupled to a fixed bias. As another example, one out of every three bitlines of a group of contiguous bitlines may be sensed (e.g., every third bitline is sensed) while two out of every three bitlines of the group are coupled to a fixed bias. As yet another example, one out of every eight bitlines of a group of contiguous bitlines may be sensed (e.g., every eighth bitline may be sensed) while seven out of every eight bitlines of the group are coupled to a fixed bias. In various embodiments, regardless of the particular proportions used, the sensed bitlines may be distributed such that no sensed bitline is immediately adjacent another sensed bitline.

During a read operation, the bitlines that are not being sensed may be coupled to any suitable fixed bias voltage (i.e., a voltage that is relatively constant from the time the wordline is activated to the time the bitlines are sensed). For example, in the embodiment depicted, the bitlines are coupled to $V_{SRC}$. In other embodiments, the bitlines may be coupled to GND, $V_{CC}$ (i.e., the main power supply voltage for the storage device 106, in some embodiments other voltages used within the storage device may be derived from $V_{CC}$), or other suitable fixed bias voltage. In a particular embodiment, the bitlines that are not sensed are all coupled to the same fixed bias, though in other embodiments, the bitlines may be coupled to any number of fixed bias voltages.

Figure 5:
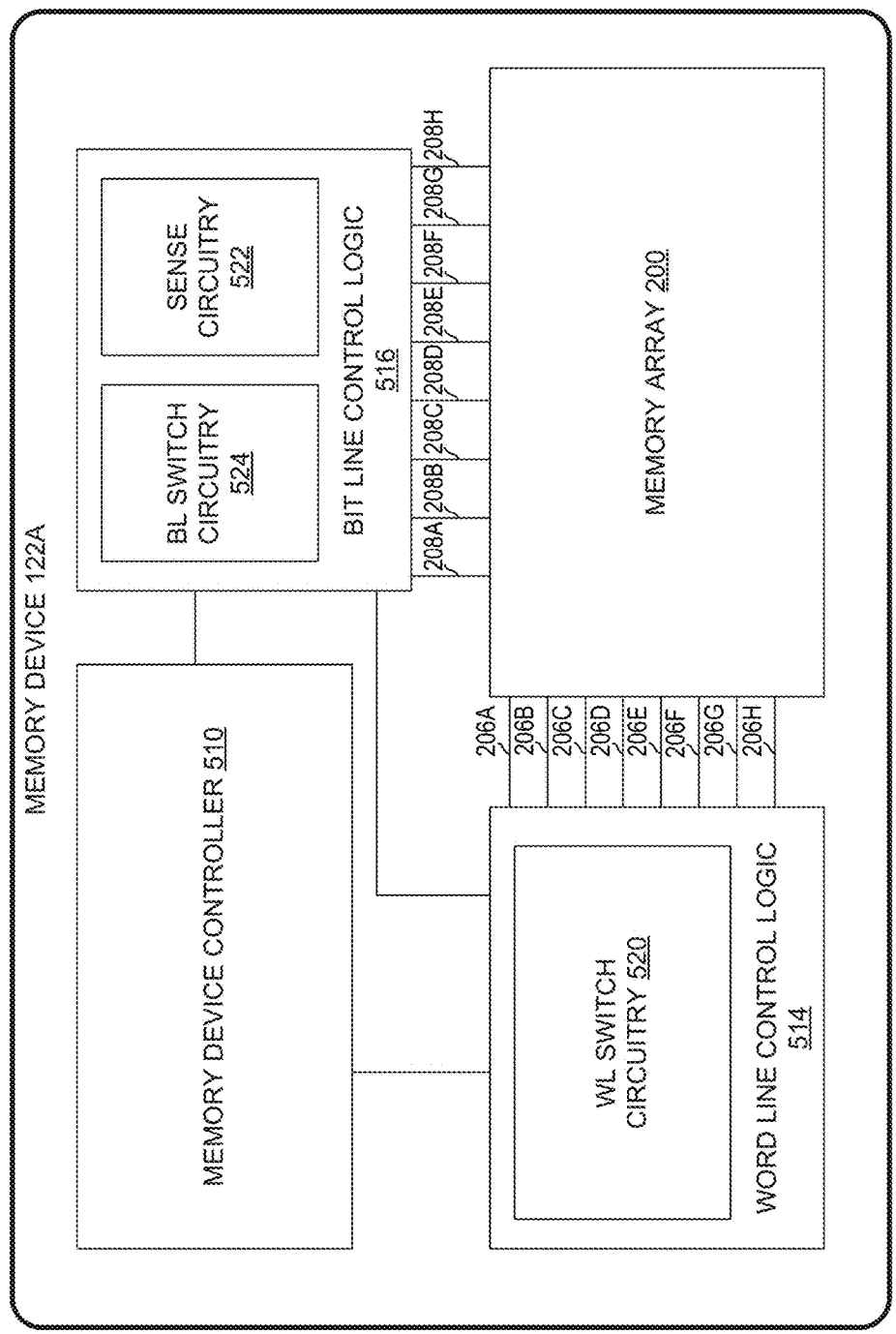
FIG. 5 illustrates an example memory device in accordance with certain embodiments.

FIG. 5 illustrates an example memory device 122A in accordance with certain embodiments. In the embodiment of FIG. 5, a memory device 122A includes memory device controller 510, word line control logic 514, bit line control logic 516, and one or more memory arrays 200 (each array may be associated with its own memory device controller 510, word line control logic 514, and/or bit line control logic 516 or may share these components with one or more other memory arrays 200). A host computing device (e.g., CPU 102) may provide read and/or write commands including logical memory address(es) and/or associated data to memory device 122A (e.g., via storage device controller 118) and may receive data read from memory device 122A (e.g., via the storage device controller 118). Memory device controller 510 (in conjunction with word line control logic 514 and bit line control logic 516) is configured to perform memory access operations, e.g., reading target memory cells and/or writing to target memory cells. As described above, memory array 200 may include a plurality of word lines 206 (e.g., 206A-206H), a plurality of bit lines 208 (e.g., 208A-208H) and a plurality of memory cells that are each coupled to a respective word line and bit line. Memory array 200 may include any suitable number of word lines 206 and any suitable number of bit lines 208.

Memory device controller 510 may communicate with storage device controller 118 (which itself may communicate with a host computing device) to facilitate memory operations. As an example, a host computing device may send to the storage device 106 a read command specifying, e.g., a logical block address to be read from the storage device 106. The logical block address identifies a logical block of data (in some embodiments a logical block is the smallest unit of data that may be read from or written to the storage device by the host computing device). The logical block data size, which may be specified in bytes, is generally (though not required to be) a power of two. Example logical block sizes include 512 bytes, 1 KB, 2 KB, 4 KB, 8 KB, etc. Storage device controller 118 may determine which memory device 122 stores data at a physical address corresponding to the logical block address. The storage device controller 118 may send a read command to the identified memory array (e.g., 122A). In various embodiments, the read command sent to the memory device 122A may include one or more logical and/or physical addresses. In one example, the read command sent by storage device controller 118 to a memory device 122A may include a row address and a column address determined by the storage device controller 118 based at least in part on a logical block address included in the read command received from the host computing device. In a particular embodiment, the row address may include a logical unit number address, a block address (where a block includes multiple pages), and a page address (where in some embodiments a page is the smallest addressable unit of memory device 122A for read and program operations); and the column address may specify an offset into the page (which may expressed in terms of bytes or other suitable unit). Any suitable page size may be utilized. Example page sizes may include 512 bytes, 1 KB, 2 KB, 4 KB, 8 KB, 16 KB, etc. In particular embodiments, in addition to including storage for data, each page may be associated with a group of spare bits that may be used, e.g., to store error correction or other information. In a particular embodiment, a page may comprise a group of memory cells that are coupled to a common wordline and in which each memory cell of the page is also coupled to a series string of a group of physically contiguous series strings (that may be selectively coupled to a group of physically contiguous bitlines).

In a particular embodiment, memory device controller 510 may analyze a command to determine whether the command is to be consumed by memory device 122A. For example, in some embodiments, storage device controller 118 may send commands to multiple different memory devices 122 via a bus. A controller of each memory device 122 may analyze the command to determine whether the command is addressed to the respective memory device. For example, memory device controller 510 may analyze an address of the command and/or the value on an enable signal line (e.g., a chip enable signal) coupled to the storage device controller 118 and memory device 122A to determine whether the command is to be consumed by memory device 122A.

In various embodiments, a read command received by memory device controller 510 (e.g., from storage device controller 118) may include any suitable information providing for the identification of a group of memory cells of memory array 200 that are to be read in response to the read instruction. For example, as described above, the read instruction may include a row address and/or a column address. In other examples, the read instruction may include any suitable information identifying a group of memory cells to be read (e.g., an identification of a wordline and/or bitline). In various embodiments, the read instruction may specify an amount of data to be read, such as a quarter of a page, one half of a page, one page, multiple pages, or other page amount. In some embodiments, the read instruction my specify whether a normal read is to be performed (wherein contiguous bitlines may be sensed during the same read operation) or whether a shielded read is to be performed (wherein one or more bitlines in between sensed bitlines are coupled to a fixed bias in order to shield the bitlines being sensed). In other embodiments, the memory device 122A may be configured to perform a shielded read in response to each read command (e.g., a read command does not need to explicitly specify a shielded read to cause a shielded read to be performed).

The memory device controller 510 is configured to, in response to a read command, determine which bitlines should be sensed during a shielded read and which bitlines should be coupled to a fixed bias (i.e., "shielding bitlines"). The memory device controller 510 may determine these bitlines based on information included in the read command. For example, the sensed and shielding bitlines may be determined based on one or more of a page identifier, a starting column or bitline identifier, an amount of data to be read, an indication of whether a shielded read is to be performed, and/or other parameters of the read instruction.

In various embodiments, the order in which data is programmed into memory cells coupled to a wordline may be determined in a manner that preserves the ability to perform a shielded read operation on the data. As an example only (since the number of memory cells of a memory array 200 is generally much larger than depicted in FIG. 5), a logical block of data specified in a write or read command may correspond to four memory cells while a page of data stored in the memory array 200 includes eight bits. Thus, the eight cells coupled to wordline 206A (since there are eight bitlines 208A-208H) may store two logical blocks in an SLC configuration. In a typical configuration in which shielded reads are not used, a first logical block may be written to the cells coupled to bitlines 208A-D and a second logical block may be written to the cells coupled to bitlines 208E-208H. Thus, a write command received by memory device controller 510 for the first logical block may specify that the data is to be written starting at bitline 208A and a write command for the second logical block may specify that the data is to be written starting at bitline 208E.

In a particular embodiment utilizing shielded reads, the same write commands may be used as in the example described above, but may result in the first logical block being written to memory cells coupled to bitlines 208A, 208C, 208E, and 208G; and the second logical block being written to memory cells coupled to bitlines 208B, 208D, 208F, and 208H. Thus, even though the second write command refers to a starting bitline of 208E, the actual starting bitline used during the programming operation is 208B. Thus, memory device controller 510 may perform a translation between an indicated bitline of the program instruction and the actual starting bitline. Thus, the shielded read architecture could be used by the memory device 122A without modification of the storage device controller 118. In another embodiment, the storage device controller 118 may account for shielded reads and send an indication of the actual starting bitline in each read and write command. Thus, the second write command sent from the storage device controller 118 to memory device controller 510 may include an indication of bitline 208B as the starting bitline.

In various embodiments, a single program sequence may be used to program memory cells of a wordline that are to be read using separate shielded read operations. For example, reusing the illustration above, a first logical block of data may be written to memory cells coupled to bitlines 208A, 208C, 208E, and 208G; and a second logical block of data may be written to memory cells coupled to bitlines 208B, 208D, 208F, and 208H during the same program sequence. In such an embodiment, either storage device controller 118 or memory device controller 510 may aggregate write commands (e.g., when the write commands specify write data that fills only a portion of the memory cells of a wordline) so that all of the memory cells of the wordline may be written to during a single program sequence or may perform write commands at a granularity that is different from the granularity of read commands (e.g., a write command may write to all of the memory cells of a wordline while a shielded read may read from one half of the memory cells of the wordline).

In various embodiments, read commands for each logical block may follow the format of the corresponding write command for the logical block (thus the read instructions may include an indication of a starting bitline, which could be the actual starting bitline or may be converted by memory device controller 510 to determine the actual starting bitline). The starting bitline may be identified in any suitable manner (e.g., the commands do not have to explicitly specify the physical address of the bitline, but could specify a logical address that is converted into a physical bitline address by memory device controller 510). In a particular embodiment, a first logical address specified in a command from a host computing device may correspond to data located in memory cells coupled to a wordline and even numbered columns (e.g., series strings) while the next contiguous logical address may correspond to data located in memory cells coupled to the wordline and odd numbered columns.

In a particular embodiment, the memory device controller 510 may receive read commands from the storage device controller 118 that specify whether a whole page (e.g., all of the bitlines) should be read or whether a half page (e.g., every other bitline) should be read. In response to a command specifying that a whole page should be read, the memory device controller 510 may cause all of the bitlines to be sensed (i.e., without a shielded read), while in response to the command specifying that a half page should be read, the memory device controller 510 may cause every other bitline (e.g., even numbered bitlines or odd numbered bitlines) to be sensed while causing the remaining bitlines to be coupled to a fixed bias voltage to effectuate a shielded read.

In various embodiments, when multiple logical blocks are programmed into cells coupled to a wordline in a manner allowing for a shielded read at a future time (e.g., a first logic block is programmed to cells coupled to bitlines 208A, 208C, 208E, and 208G and a second logic block is programmed to cells coupled to bitlines 208B, 208D, 208F, and 208H), the logical blocks may be programmed during the same operation. Conversely, when a shielded read is performed, a separate read operation is used to read each logical block of data since the bitlines not being read are set to the bias voltage.

Wordline (WL) control logic 514 includes WL switch circuitry 520. WL control logic 514 is configured to receive a target WL address from memory device controller 510 and to activate a WL for reading and/or writing operations. For example, WL control logic 514 may be configured to activate a target WL by coupling a WL read voltage bias to the target WL.

WL control logic 514 may be coupled to a plurality of WLs 206 included in memory array 200. Each WL may be coupled to a number of memory cells corresponding to a number of BLs 208. WL switch circuitry 520 may include a plurality of switches configured to couple (or decouple) a respective WL, e.g., WL 206A, to one or more WL read voltage biases to activate the respective WL 206A. For example, WL switch circuitry 520 may include a plurality of transistors or other circuit components that may function as switches. WL switch circuitry 520 may also include a plurality of switches (which may be the same switches described above or different switches) to couple unselected wordlines to a pass voltage (illustrated as VpassR in FIGS. 6A and 6B), where the pass voltage is a voltage that is higher than the read voltages applied to activated wordlines (and operates to ensure that each memory cell coupled to an unselected wordline is in a conductive state).

Bitline (BL) control logic 516 includes BL switch circuitry 524 and sense circuitry 522. BL control logic 516 is configured to receive target BL addresses from memory device controller 510 and to select BLs for reading and/or writing operations. BL control logic 516 may be configured to couple the target bitlines to their respective series strings 204 during at least a portion of a read operation. BL control logic 516 may also be configured to couple bitlines that are not being sensed to a fixed bias during a read operation when a shielded read is performed. BL control logic 516 may also be configured to couple bitlines for which the corresponding memory cell value has been determined to ground (or other fixed bias voltage) for the remainder of the read operation.

Sense circuitry 522 is configured to detect a voltage or current on each sensed bitline indicative of a state (e.g., a threshold voltage) of the memory cell coupled to the respective bitline during a read operation. Sense circuitry 522 is configured to determine bit values of the data stored in the memory cells based on the detected states of the memory cells. Sense circuitry may provide the values to one or more other components of memory device 122A, e.g., memory device controller 510. The sense circuitry 522 may include any suitable circuitry to sense a current or voltage of various bitlines, such as voltage comparators (i.e., sense amps).

Figure 6A:
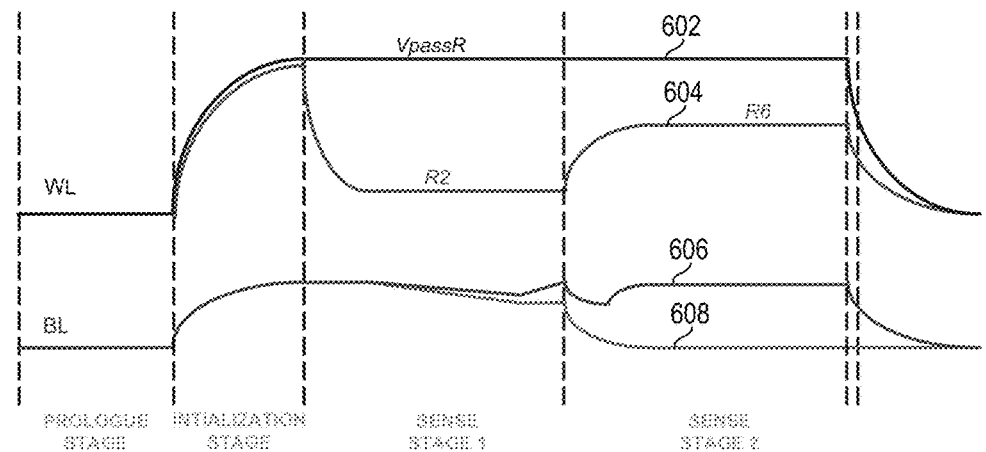
FIGS. 6A and 6B illustrate example voltage waveforms in accordance with certain embodiments.
Figure 6B:
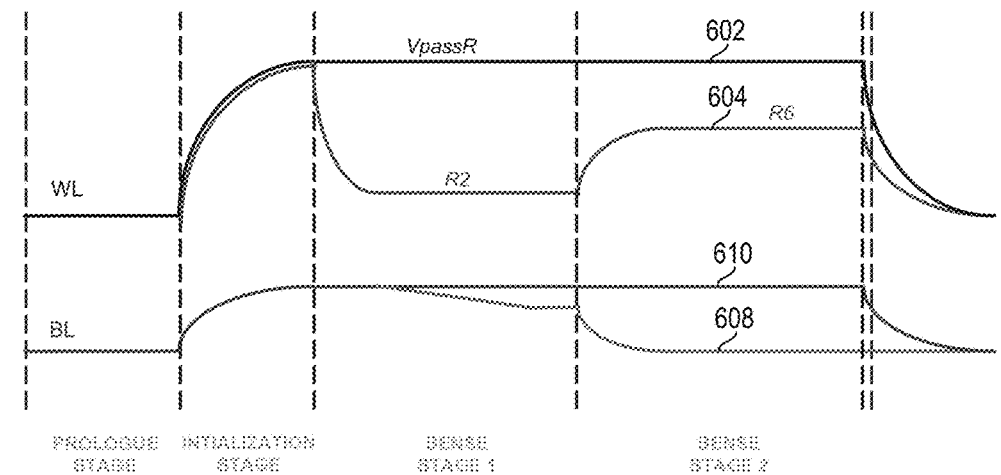

FIGS. 6A and 6B illustrate example voltage waveforms in accordance with certain embodiments. FIG. 6A represents example waveforms that may be used in an ABL architecture where all bitlines are sensed during the same read operation. Waveform 602 represents the voltage waveform of an example wordline that is not selected for the read operation. As depicted, during the initialization stage, the voltage of the wordline is ramped up to a pass voltage (VpassR) which is higher than any of the read voltages that are applied to the selected wordline. The wordline remains at this voltage until the sense stage(s) are over. In some embodiments, each wordline of a memory array 200 that is not selected for the read operation is ramped up to VpassR in a similar manner.

Waveform 604 represents the voltage waveform of an example wordline that is selected for the read operation. In the embodiment depicted, the voltage of the wordline is ramped up to VpassR (or a level slightly below VpassR) during the initialization stage. During a sense stage, the wordline voltage is adjusted to a read level. For example, during the first sense stage, the wordline voltage is adjusted to R2 and during the second sense stage the wordline voltage is adjusted to R6. After the last sense stage is over, the wordline voltage is lowered back to a baseline level (e.g., GND).

A read operation may include any suitable number of sense stages depending on the number of bits stored per memory cell and the number of pages (or partial pages) being read during the read operation. In the embodiment depicted, the voltage waveforms depict a read operation reading a single page from a TLC memory.

Waveform 606 represents the voltage waveform of a first bitline of a memory array 200 and waveform 608 represents the voltage waveform of a second bitline of memory array 200, where the first bitline is a neighbor of the second bitline (i.e., the bitlines are immediately adjacent to each other). Because of capacitive coupling between the neighbor bitlines, a change in voltage in one bitline may affect the voltage of the other bitline. As an example, in the embodiment depicted, the application of R2 to the wordline coupled to the memory cell coupled to the second bitline (corresponding to waveform 608) causes the voltage of the second bitline to drop (this example assumes that the threshold voltage of the memory cell coupled to the second bitline is lower than R2, thus causing the second bitline to conduct). Even when the threshold voltage of the memory cell coupled to the first bitline is higher than R2, the voltage of the first bitline may drop due to capacitive coupling between the first bitline and the second bitline. Once the voltage on the second bitline reaches a steady state, the voltage on the first bitline may start recovering (shown at the end of sense stage 1). In the embodiment depicted, the second bitline is pulled low (e.g., to $V_{SRC}$) during sense stage 2 (since the state of the memory cell was determined in stage 1), whereas if the second bitline had not been pulled low during sense stage 1, it would instead be sensed again during stage 2. As depicted, the voltage drop of the second bitline during sense stage 2 also causes the first bitline to drop because of the capacitive coupling.

With the exception of waveform 610, the waveforms of FIG. 6B are the same as the waveforms of FIG. 6A. However, FIG. 6B corresponds to an architecture utilizing a shielded read. The bitline waveforms 608 and 610 of FIG. 6B correspond to bitlines that are separated from each other by at least one bitline coupled to a fixed bias during the sense operation. For example, a first bitline may correspond to waveform 610, a second bitline may correspond to waveform 608, and a bitline directly adjacent to and located in between the first bitline and the second bitline may be coupled to a fixed bias. In other embodiments, multiple contiguous bitlines in between the first and second bitline may be coupled to a fixed bias voltage. Waveform 610 shows that the first bitline is no longer materially affected by drops in the voltage of the second bitline. Accordingly, the sense stages may be shortened when using a shielded read (i.e., the sense circuitry may sense at an earlier time than in the embodiment of FIG. 6A since the voltage difference between conducting and non-conducting bitlines develops more quickly in the embodiment of FIG. 6B and the sense circuitry does not need to wait for the bitline coupling to settle during the sense stage).

In various embodiments, shielded reads as described herein may be performed with architectures utilizing stepped or ramped wordline read voltages. During a read operation in a stepped architecture, the wordline voltage is set to a predetermined read level (e.g., R2) and held at that read level until a sense operation is performed. The wordline voltage may then be set to a different predetermined read level (e.g., R6) and held at that read level until a sense operation is performed. FIGS. 6A and 6B depict a stepped architecture. A shielded read may also be performed in a ramped architecture. In a ramped architecture, the wordline voltage starts at a low level and is constantly ramped up (e.g., in a generally linear fashion). Alternatively, the wordline voltage may start at a high level and be ramped down. The sense circuitry is configured to sense the bitlines (and latch the sensed data) at predefined time intervals (which may or may not vary in length).

In various embodiments, shielded reads may be used in conjunction with a hybrid architecture which may alternate between utilizing a stepped architecture and a ramped architecture. For example, memory device controller 510 may determine whether to use a stepped architecture or a ramped architecture for a shielded read operation based on the number of sense operations that are to be performed at various read levels. For example, when sense operations are to be performed at relatively few read levels during a shielded read operation, a stepped architecture may be used and when sense operations are to be performed at a relatively large number of read levels during a shielded read operation, a ramped architecture may be used.

In a particular embodiment, when data is stored in the memory cells of memory array 200 according to an SLC encoding scheme, a stepped architecture is used for all shielded reads. In a particular embodiment, when data is stored in the memory cells of memory array 200 according to an MLC encoding scheme, a stepped architecture is used for all shielded reads (whether reading a single bit from each cell or two bits from each cell). In a particular embodiment, when data is stored in the memory cells of memory array 200 according to a TLC encoding scheme, a ramped architecture is used for shielded reads that involve sensing data at four different wordline voltage levels (e.g., when at least a portion of an XP is read), while a stepped architecture is used for shielded reads that involve sensing data at less than four different wordline voltage levels (e.g., when sensing at two levels to read at least a portion of a UP or when sensing at one level to read at least a portion of an LP). In a particular embodiment, when data is stored in the memory cells of memory array 200 according to a QLC encoding scheme, a ramped architecture is used for shielded reads that involve sensing data at four or more different wordline voltage levels (e.g., when four read levels are sensed to read at least a portion of an XP or when eight read levels are sensed to read at least a portion of a TP), while a stepped architecture is used for shielded reads that involve sensing data at less than four different wordline voltage levels (e.g., when sensing at two read levels to read at least a portion of a UP or when sensing at one level to read at least a portion of an LP).

Shielded reads may be performed in response to any suitable type of read command initiating the reading of data from memory cells of the memory array 200. As described above, a shielded read may be performed in response to a read command received from a host computing device (or any read command that is derived therefrom, such as a read command sent from storage device controller 118 to memory device controller 510). As another example, one or more shielded reads may be performed in response to a program verify read command that may be issued during a program operation or a read command associated with a channel calibration command.

During the course of a programming operation, a voltage pulse may be applied to various bitlines and then a program verify read operation may be performed on bitlines that have not yet been verified to determine whether they have reached the appropriate program level (once a bitline has reached the appropriate program level, programming associated with that bitline is complete). In various embodiments, a shielded read may be performed in response to a program verify read command by ensuring that no two bitlines that are read during the program verify read operation are directly adjacent to each other. In particular embodiments, this may include coupling one or more bitlines that are in between two bitlines being read to a fixed bias voltage using techniques such as those described above. In various embodiments, a program verify read operation may generate confidence level information about the determined state of the memory cells to aid error correction logic. For example, the confidence level information may indicate the likelihood that a particular memory cell is programmed to the appropriate level.

During a channel calibration operation, various wordline read levels are applied during distinct read operations in order to determine a read level (e.g., R1, R2, R3, or other read level) to be used to distinguish between states of the memory cells. For example, shielded reads may be performed for each of a series of wordline voltage levels and the wordline voltage level with the best results may be selected as a read level to be used during normal read operations (e.g., to perform reads requested by a host computing device). For each read level, (e.g., R1 if SLC encoding is used, R1, R2, and R3 if MLC encoding is used, R1-R7 if TLC encoding is used, R1-R15 if QLC encoding is used) a series of wordline voltage levels may be tested using shielded reads and the best candidate voltage may be selected as the particular read level.

In various embodiments, the datapath is designed to accommodate the appropriate bitline data pattern for shielded reads. For example, a typical wordline includes a number of memory cells used to store data and a number of memory cells used to store error-correcting code (ECC) information. In various embodiments, the pattern used for the shielded read is also applied to read the ECC information. For example, if every other bitline is read and every other bitline is coupled to a fixed bias, then every other bitline of the bitlines coupled to memory cells storing ECC information is read and every other bitline of the bitlines coupled to memory cells storing ECC information is coupled to a fixed bias. Thus, in a particular embodiment, even numbered columns may be used to store ECC information for even numbered columns read during a shielded read and odd numbered columns may be used to store ECC information for odd numbered columns read during a shielded read (or odd numbered columns could store ECC information for even numbered columns storing data, or vice versa). In a particular embodiment, the first logically contiguous 8 kB main data (from the viewpoint of the host computing device) and its associated ECC code information are stored in even columns and the last logically contiguous 8 kB main data and its associated ECC code information are stored in the odd columns. Various embodiments may also include appropriate redundancy architecture to facilitate shielded bitline usage with redundant columns.

Figure 7:
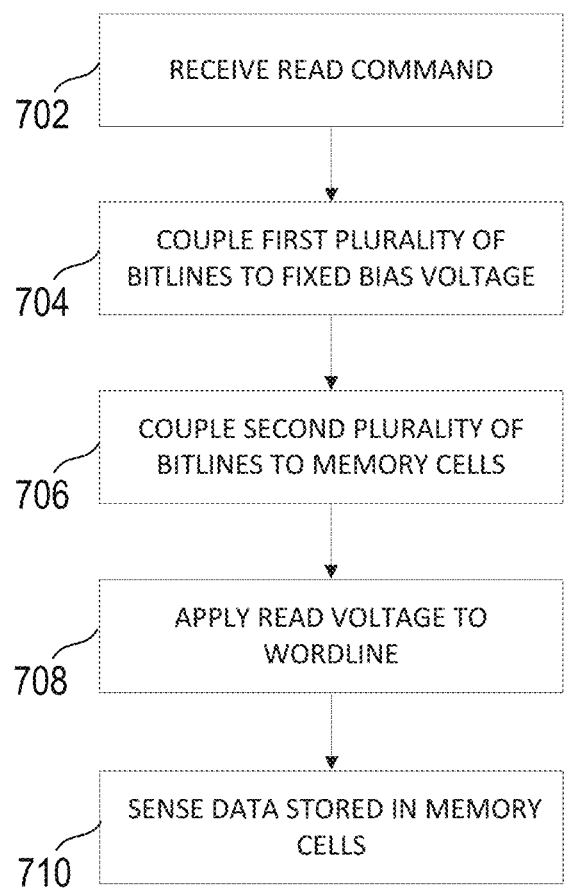
FIG. 7 illustrates an example flow for performing a shielded read in accordance with certain embodiments.

FIG. 7 illustrates an example flow 700 for performing a shielded read in accordance with certain embodiments. The flow 700 depicts example operations that may be performed by any suitable logic, such as a storage device 106, a storage device controller 118, a memory device 122A, a memory device controller 510, and/or a memory array 200.

At 702, a read command is received. The read command may represent any suitable read command resulting in the sensing of data stored in memory cells of memory array 200. For example, the read command may be a read command received from a host computing device (or a read command derived therefrom), a read command performed during a program verify operation, or a read command performed during a wordline read voltage calibration procedure.

At 704, a first plurality of bitlines of the memory array are coupled to a fixed bias voltage. The bitlines that are coupled to the fixed bias voltage may be selected in any suitable manner. For example, the read command may specify one or more addresses and the bitlines to be coupled to the fixed bias voltage may be selected based on the one or more addresses. As another example, the bitlines may be selected based solely on the type of read command being performed (e.g., in one embodiment the odd numbered bitlines, the even numbered bitlines, three out of every four bitlines, or other pattern of bitlines may be selected each time a wordline calibration procedure is performed).

At 706, a second plurality of bitlines are coupled to their respective memory cells. The bitlines that are coupled to the fixed bias voltage may be selected in any suitable manner. For example, the read command may specify one or more addresses and the bitlines to be coupled to their respective memory cells may be selected based on the one or more addresses. As another example, the bitlines may be selected based solely on the type of read command being performed (e.g., in one embodiment the odd numbered bitlines, the even numbered bitlines, every fourth bitline, or other pattern of bitlines may be selected each time a wordline calibration procedure is performed). In a particular embodiment, the bitlines of the memory array that are not selected to be coupled to the fixed bias are selected to be coupled to their respective memory cells.

At 708, a read voltage is applied to a wordline (e.g., the wordline specified by the read command). In various embodiments, various read voltages may be applied to the wordline in a stepped or ramped fashion based on the encoding scheme and the number of bits being read. At 710, data stored in the memory cells coupled to their respective bitlines is sensed. In various embodiments, the data may be sensed at various read voltages while the first plurality of bitlines remain coupled to the fixed bias voltage (or are recoupled to the fixed bias voltage prior to each sensing operation).

The flow described in FIG. 7 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 7 may be repeated, combined, modified or deleted where appropriate. Additionally, operations may be performed in any suitable order without departing from the scope of particular embodiments.

Although various embodiments have been described with respect to particular encoding schemes (e.g., MLC, TLC, QLC), the teachings of such embodiments may be equally applicable to memories using any suitable encoding levels, including encoding schemes that become feasible in the future.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory 116, memory devices 122A-D, storage device controller 118, address translation engine 120, program control logic 124, memory array 200, memory device controller 510, word line control logic 514, bitline control logic 516, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a NAND flash memory device comprising a memory device controller and a memory NAND flash memory array, the NAND flash memory device to program data into a plurality of NAND flash memory cells coupled to a wordline in a single program sequence, wherein the plurality of NAND flash memory cells are coupled to a first plurality of bitlines and a second plurality of bitlines; couple the first plurality of bitlines to a fixed bias voltage in response to a first read command; apply a read voltage to the wordline coupled to the plurality of NAND flash memory cells; and sense, via the second plurality of bitlines, data stored in NAND flash memory cells coupled to the wordline, wherein at least some bitlines of the second plurality of bitlines are each in between and directly adjacent to two respective bitlines coupled to the fixed bias voltage.

In an embodiment, the NAND flash memory device is further to couple the second plurality of bitlines to the fixed bias voltage in response to a second read command; apply a read voltage to the wordline coupled to the plurality of NAND flash memory cells; and sense, via the first plurality of bitlines, data stored in NAND flash memory cells coupled to the wordline, wherein at least some bitlines of the first plurality of bitlines are each in between and directly adjacent to two respective bitlines coupled to the fixed bias voltage. In an embodiment, the first plurality of bitlines coupled to the fixed bias voltage comprises every other bitline of a set of bitlines. In an embodiment, the first plurality of bitlines coupled to the fixed bias voltage comprises three out of every four contiguous bitlines of a set of bitlines. In an embodiment, the apparatus further comprises a storage device controller to communicate the first read command to the memory device controller, and wherein the memory device controller is to determine which bitlines to couple to the fixed bias voltage based on at least one address included in the first read command. In an embodiment, the first read command is received from a host computing device coupled to the storage device. In an embodiment, the first read command is a program verify command performed during a program operation to verify whether a plurality of NAND flash memory cells are programmed to appropriate voltage levels. In an embodiment, the first read command is performed during a calibration procedure that is to determine one or more read voltage levels to be applied to the wordline in response to receiving a read command from a host computing device. In an embodiment, the sensing of the second plurality of bitlines is performed at predefined time intervals during a ramping up of the read voltage of the wordline from an initial voltage to a final voltage in a generally linear fashion. In an embodiment, the sensing of the second plurality of bitlines is performed after the read voltage applied to the wordline is stepped up and held constant for a for a period of time.

In at least one embodiment, a method comprises programming data into a plurality of NAND flash memory cells coupled to a wordline in a single program sequence, wherein the plurality of NAND flash memory cells are coupled to a first plurality of bitlines and a second plurality of bitlines; coupling the first plurality of bitlines to a fixed bias voltage in response to a first read command; applying a read voltage to the wordline coupled to the plurality of NAND flash memory cells; and sensing, via the second plurality of bitlines, data stored in NAND flash memory cells coupled to the selected wordline, wherein at least some bitlines of the second plurality of bitlines are each in between and directly adjacent to two respective bitlines coupled to the fixed bias voltage.

In an embodiment, the method further comprises coupling the second plurality of bitlines to the fixed bias voltage in response to a second read command; applying a read voltage to the wordline coupled to the plurality of NAND flash memory cells; and sensing, via the first plurality of bitlines, data stored in NAND flash memory cells coupled to the wordline, wherein at least some bitlines of the first plurality of bitlines are each in between and directly adjacent to two respective bitlines coupled to the fixed bias voltage. In an embodiment, the first plurality of bitlines coupled to the fixed bias voltage comprises every other bitline of a set of bitlines. In an embodiment, the first plurality of bitlines coupled to the fixed bias voltage comprises three out of every four contiguous bitlines of a set of bitlines. In an embodiment, the method further comprises communicating, by a storage device controller, the first read command to a memory device controller, and wherein the memory device controller is to determine which bitlines to couple to the fixed bias voltage based on at least one address included in the first read command. In an embodiment, the first read command is received from a host computing device coupled to the storage device. In an embodiment, the first read command is a program verify command performed during a program operation to verify whether a plurality of NAND flash memory cells are programmed to appropriate voltage levels. In an embodiment, the first read command is performed during a calibration procedure that is to determine one or more read voltage levels to be applied to the wordline in response to receiving a read command from a host computing device. In an embodiment, the sensing of the second plurality of bitlines is performed at predefined time intervals during a ramping up of the read voltage of the wordline from an initial voltage to a final voltage in a generally linear fashion. In an embodiment, the sensing of the second plurality of bitlines is performed after the read voltage applied to the wordline is stepped up and held constant for a for a period of time. In an embodiment, the method further comprises determining whether to ramp or step up the read voltage based on the number of read voltages to be sensed during a read operation performed in response to the read command. In an embodiment, the fixed bias voltage is a source bias voltage ($V_{SRC}$). In an embodiment, a system comprises means to perform the methods described above. In an embodiment, the means comprise machine-readable code that when executed, cause a machine to perform one or more steps of the methods. In an embodiment, the system further comprises a battery communicatively coupled to a processor, a display communicatively coupled to the processor, or a network interface communicatively coupled to the processor.

In at least one embodiment, a non-transitory machine readable storage medium has instructions stored thereon, the instructions when executed by a machine to cause the machine to program data into a plurality of NAND flash memory cells coupled to a wordline in a single program sequence, wherein the plurality of NAND flash memory cells are coupled to a first plurality of bitlines and a second plurality of bitlines; couple the first plurality of bitlines to a fixed bias voltage in response to a first read command; apply a read voltage to the wordline coupled to a plurality of NAND flash memory cells; and sense, via the second plurality of bitlines, data stored in NAND flash memory cells coupled to the selected wordline, wherein at least some bitlines of the second plurality of bitlines are each in between and directly adjacent to two respective bitlines coupled to the fixed bias voltage.

In an embodiment, the instructions when executed by the machine are to further cause the machine to couple the second plurality of bitlines to the fixed bias voltage in response to a second read command; apply a read voltage to the wordline coupled to the plurality of NAND flash memory cells; and sense, via the first plurality of bitlines, data stored in NAND flash memory cells coupled to the wordline, wherein at least some bitlines of the first plurality of bitlines are each in between and directly adjacent to two respective bitlines coupled to the fixed bias voltage. In an embodiment, the first plurality of bitlines coupled to the fixed bias voltage comprises every other bitline of a set of bitlines. In an embodiment, the first read command is received from a host computing device coupled to the storage device. In an embodiment, the first read command is performed during a calibration procedure that is to determine one or more read voltage levels to be applied to the wordline in response to receiving a read command from a host computing device.

In at least one embodiment, a system comprises a host computing device comprising a processor, the host computing device to send read commands to a storage device; and a storage device comprising at least one NAND flash memory array; wherein the storage device is to program data into a plurality of NAND flash memory cells coupled to a wordline in a single program sequence, wherein the plurality of NAND flash memory cells are coupled to a first plurality of bitlines and a second plurality of bitlines; couple the first plurality of bitlines to a fixed bias voltage in response to a first read command; apply a read voltage to the wordline coupled to the plurality of NAND flash memory cells; and sense, via the second plurality of bitlines, data stored in NAND flash memory cells coupled to the wordline, wherein at least some bitlines of the second plurality of bitlines are each in between and directly adjacent to two respective bitlines coupled to the fixed bias voltage.

In an embodiment, the storage device is further to couple the second plurality of bitlines to the fixed bias voltage in response to a second read command; apply a read voltage to the wordline coupled to the plurality of NAND flash memory cells; and sense, via the first plurality of bitlines, data stored in NAND flash memory cells coupled to the selected wordline, wherein at least some bitlines of the first plurality of bitlines are each in between and directly adjacent to two respective bitlines coupled to the fixed bias voltage. In an embodiment, the first plurality of bitlines coupled to the fixed bias voltage comprises every other bitline of a set of bitlines. In an embodiment, the first read command is sent to the storage device by the host computing device. In an embodiment, the first read command is a program verify command performed during a program operation to verify whether a plurality of NAND flash memory cells are programmed to appropriate voltage levels.

In at least one embodiment, a system comprises means to program data into a plurality of NAND flash memory cells coupled to a wordline in a single program sequence, wherein the plurality of NAND flash memory cells are coupled to a first plurality of bitlines and a second plurality of bitlines; means to couple the first plurality of bitlines to a fixed bias voltage in response to a first read command; means to apply a read voltage to the wordline coupled to the plurality of NAND flash memory cells; and means to sense, via the second plurality of bitlines, data stored in NAND flash memory cells coupled to the selected wordline, wherein at least some bitlines of the second plurality of bitlines are each in between and directly adjacent to two respective bitlines coupled to the fixed bias voltage.

In an embodiment, the system further comprises means to couple the second plurality of bitlines to the fixed bias voltage in response to a second read command; means to apply a read voltage to the wordline coupled to the plurality of NAND flash memory cells; and means to sense, via the first plurality of bitlines, data stored in NAND flash memory cells coupled to the selected wordline, wherein at least some bitlines of the first plurality of bitlines are each in between and directly adjacent to two respective bitlines coupled to the fixed bias voltage. In an embodiment, the first plurality of bitlines coupled to the fixed bias voltage comprises every other bitline of a set of bitlines. In an embodiment, the first read command is sent to the storage device by the host computing device. In an embodiment, the first read command is a program verify command performed during a program operation to verify whether a plurality of NAND flash memory cells are programmed to appropriate voltage levels.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a NAND flash memory device comprising a memory device controller and a NAND flash memory array, the NAND flash memory device to:
   program data into a plurality of NAND flash memory cells coupled to a wordline in a single program sequence, wherein the plurality of NAND flash memory cells are coupled to a first plurality of bitlines and a second plurality of bitlines;
   couple the first plurality of bitlines to a fixed bias voltage in response to a first read command;
   select one of a stepped architecture and a ramped architecture of the NAND flash memory device to apply one or more read voltages to the wordline in response to the first read command, the selection performed by the NAND flash memory device based on a number of sense operations to be performed during performance of the first read command;
   apply the one or more read voltages to the wordline coupled to the plurality of NAND flash memory cells via the selected stepped or ramped architecture; and
   sense, via the second plurality of bitlines, data stored in NAND flash memory cells coupled to the wordline, wherein at least some bitlines of the second plurality of bitlines are each in between and directly adjacent to two respective bitlines coupled to the fixed bias voltage.

2. The apparatus of claim 1, wherein the NAND flash memory device is further to:
couple the second plurality of bitlines to the fixed bias voltage in response to a second read command;
apply a read voltage to the wordline coupled to the plurality of NAND flash memory cells; and
sense, via the first plurality of bitlines, data stored in NAND flash memory cells coupled to the wordline, wherein at least some bitlines of the first plurality of bitlines are each in between and directly adjacent to two respective bitlines coupled to the fixed bias voltage.

3. The apparatus of claim 1, wherein the first plurality of bitlines coupled to the fixed bias voltage comprises every other bitline of a set of bitlines.

4. The apparatus of claim 1, further comprising a storage device controller to communicate the first read command to the memory device controller, and wherein the memory device controller is to determine which bitlines to couple to the fixed bias voltage based on at least one address included in the first read command.

5. The apparatus of claim 1, wherein the first read command is received from a host computing device coupled to the NAND flash memory device.

6. The apparatus of claim 1, wherein the first read command is a program verify command performed during a program operation to verify whether a plurality of NAND flash memory cells are programmed to appropriate voltage levels.

7. The apparatus of claim 1, wherein the first read command is performed during a calibration procedure that is to determine one or more read voltage levels to be applied to the wordline in response to receiving a read command from a host computing device.

8. The apparatus of claim 1, wherein the sensing of the second plurality of bitlines is performed at predefined time intervals during a ramping up by the ramped architecture of a read voltage of the wordline from an initial voltage to a final voltage in a generally linear fashion.

9. The apparatus of claim 1, wherein the sensing of the second plurality of bitlines is performed after a read voltage applied to the wordline is stepped up and held constant for a period of time by the stepped architecture.

10. A method comprising:
programming data into a plurality of NAND flash memory cells coupled to a wordline in a single program sequence, wherein the plurality of NAND flash memory cells are coupled to a first plurality of bitlines and a second plurality of bitlines;
coupling the first plurality of bitlines to a fixed bias voltage in response to a first read command;
selecting one of a stepped architecture and a ramped architecture to apply one or more read voltages to the wordline in response to the first read command, the selection based on a number of sense operations to be performed during performance of the first read command;
applying the one or more read voltages to the wordline coupled to the plurality of NAND flash memory cells via the selected stepped or ramped architecture; and
sensing, via the second plurality of bitlines, data stored in NAND flash memory cells coupled to the wordline, wherein at least some bitlines of the second plurality of bitlines are each in between and directly adjacent to two respective bitlines coupled to the fixed bias voltage.

11. The method of claim 10, further comprising:
coupling the second plurality of bitlines to the fixed bias voltage in response to a second read command;
applying a read voltage to the wordline coupled to the plurality of NAND flash memory cells; and
sensing, via the first plurality of bitlines, data stored in NAND flash memory cells coupled to the wordline, wherein at least some bitlines of the first plurality of bitlines are each in between and directly adjacent to two respective bitlines coupled to the fixed bias voltage.

12. The method of claim 10, wherein the first plurality of bitlines coupled to the fixed bias voltage comprises every other bitline of a set of bitlines.

13. The method of claim 10, wherein the first read command is received from a host computing device coupled to a storage device.

14. The method of claim 10, wherein the first read command is performed during a calibration procedure that is to determine one or more read voltage levels to be applied to the wordline in response to receiving a read command from a host computing device.

15. A system comprising:
a host computing device comprising a processor, the host computing device to send read commands to a storage device; and
a storage device comprising at least one NAND flash memory array;
wherein the storage device is to:
program data into a plurality of NAND flash memory cells coupled to a wordline in a single program sequence, wherein the plurality of NAND flash memory cells are coupled to a first plurality of bitlines and a second plurality of bitlines;
couple the first plurality of bitlines to a fixed bias voltage in response to a first read command;
select one of a stepped architecture and a ramped architecture of the storage device to apply one or more read voltages to the wordline in response to the first read command, the selection performed by the storage device based on a number of sense operations to be performed during performance of the first read command;
apply the one or more read voltages to the wordline coupled to the plurality of NAND flash memory cells via the selected stepped or ramped architecture; and
sense, via the second plurality of bitlines, data stored in NAND flash memory cells coupled to the wordline, wherein at least some bitlines of the second plurality of bitlines are each in between and directly adjacent to two respective bitlines coupled to the fixed bias voltage.

16. The system of claim 15, wherein the storage device is further to:
couple the second plurality of bitlines to the fixed bias voltage in response to a second read command;
apply a read voltage to the wordline coupled to the plurality of NAND flash memory cells; and
sense, via the first plurality of bitlines, data stored in NAND flash memory cells coupled to the wordline, wherein at least some bitlines of the first plurality of bitlines are each in between and directly adjacent to two respective bitlines coupled to the fixed bias voltage.

17. The system of claim 15, wherein the first plurality of bitlines coupled to the fixed bias voltage comprises every other bitline of a set of bitlines.

18. The system of claim 15, wherein the first read command is sent to the storage device by the host computing device.

19. The system of claim 15, wherein the first read command is a program verify command performed during a program operation to verify whether a plurality of NAND flash memory cells are programmed to appropriate voltage levels.

20. The apparatus of claim 2, wherein the fixed bias voltage is a source bias voltage.

* * * * *